(12) United States Patent
Redaelli et al.

(10) Patent No.: US 10,553,792 B2
(45) Date of Patent: Feb. 4, 2020

(54) TEXTURED MEMORY CELL STRUCTURES

(71) Applicant: Micron Technology, Inc., Boise, ID (US)

(72) Inventors: Andrea Redaelli, Casatenovo (IT); Mattia Boniardi, Cormano (IT); Enrico Varesi, Milan (IT); Raffaella Calarco, Berlin (DE); Jos E. Boschker, Berlin (DE)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/841,356

(22) Filed: Dec. 14, 2017

(65) Prior Publication Data
US 2018/0114902 A1  Apr. 26, 2018

Related U.S. Application Data

(62) Division of application No. 15/223,136, filed on Jul. 29, 2016.

(51) Int. Cl.
*H01L 45/00* (2006.01)
*H01L 27/24* (2006.01)

(52) U.S. Cl.
CPC ............ *H01L 45/144* (2013.01); *H01L 45/06* (2013.01); *H01L 45/1233* (2013.01); *H01L 45/1253* (2013.01); *H01L 45/1608* (2013.01); *H01L 45/1616* (2013.01); *H01L 27/2463* (2013.01)

(58) Field of Classification Search
CPC ......... H01L 45/06–065; H01L 45/1641; H01L 45/143–144; H01L 45/1233; H01L 45/1253; H01L 45/1246; H01L 45/1616; H01L 21/02444; H01L 21/02513–02516; H01L 21/02483; H01L 21/02667–02691
See application file for complete search history.

(56) References Cited

U.S. PATENT DOCUMENTS

| | | | |
|---|---|---|---|
| 3,877,049 A | 4/1975 | Buckley | |
| 4,845,533 A * | 7/1989 | Pryor | H01L 27/2463 257/4 |
| 8,134,139 B2 * | 3/2012 | Lin | H01L 45/085 257/2 |
| 8,335,106 B2 | 12/2012 | Aizawa et al. | |
| 8,530,314 B2 | 9/2013 | Tominaga et al. | |
| 9,130,157 B2 | 9/2015 | Gotti et al. | |
| 9,281,473 B1 * | 3/2016 | Suzuki | H01L 45/06 |

(Continued)

OTHER PUBLICATIONS

Lin et al., "Effect of Substrate Temperature on the Thermoelectric Properties of the Sb2Te3 Thin Films Deposition by Using Thermal Evaporation Method", Journal of Nanomaterials, vol. 2015, Article ID 135130, pp. 1-6.*

(Continued)

*Primary Examiner* — Vincent Wall
(74) *Attorney, Agent, or Firm* — Brooks, Cameron & Huebsch, PLLC

(57) ABSTRACT

The present disclosure includes textured memory cell structures and method of forming the same. In one or more embodiments, a memory cell includes a buffer portion formed on an amorphous portion and an active portion formed on the buffer portion, wherein the active portion is textured with a single out of plane orientation.

14 Claims, 3 Drawing Sheets

(56) References Cited

U.S. PATENT DOCUMENTS

| | | | |
|---|---|---|---|
| 2006/0113520 A1* | 6/2006 | Yamamoto | H01L 45/06 257/3 |
| 2007/0097738 A1 | 5/2007 | Asano et al. | |
| 2007/0160760 A1* | 7/2007 | Shin | C23C 16/305 427/255.35 |
| 2007/0297213 A1 | 12/2007 | Czubatyj et al. | |
| 2013/0181182 A1* | 7/2013 | Perniola | G11C 13/0004 257/4 |
| 2014/0151622 A1* | 6/2014 | Oyanagi | H01L 45/1233 257/2 |
| 2015/0171321 A1 | 6/2015 | Chan et al. | |

OTHER PUBLICATIONS

Bragagalia et al., "Metal-Insulator Tranistion Driven by Vacancy Ordering in GeSbTe Phase Change Materials", Scientific Reports 6, Article 23843, Apr. 1, 2016, pp. 1-6.*

Silion dioxide properties, http://www.iue.tuwien.ac.at/phd/filipovic/node26.html, Oct. 24, 2014, pp. 1-3.*

Park et al., "Effect of grain size on thermal transport in post-annealing antimony telluride thin films", Nanoscale Research letters (2015) 10:20, pp. 1-9.*

Boschker et al., "Surface Reconstruction-Induced Coincidence Lattice Formation Between Two-Dimensionally Bonded Materials and a ThreeDimensionally Bonded Substrate", Nano letters, 2014, 14 pp. 3534-3538.*

Saito, et al., "A two-step process for growth of highly oriented Sb2Te3 using sputtering", AIP Advances 6, 045220 (2016) pp. 1-5 (Year: 2016).*

Oikawa, et al. "Deposition and characterization of amorphous aluminum nitride thin films for a gate insulator", Thin Solid Films 574, Dec. 3, 2014, pp. 110-114.

Da Silva, et al. "Insights into the structure of the stable and metastable (GeTe)m (Sb2Te3)n compounds", The American Physical Society, Physical Review B 78, 224111, Dec. 30, 2008, 10 pp.

Bragaglia, et al. "Metal-Insulator Transition Driven by Vacancy Ordering in GeSbTe Phase Change Materials", Scientific Reports 6, Article 23843, Apr. 1, 2016, 6 pp.

Boschker, et al. "Electrical performance of phase change memory cells with Ge3Sb2Te6 deposited by molecular beam epitaxy", Applied Physics Letters 106, 023117, Jan. 15, 2015, 4 pp.

* cited by examiner

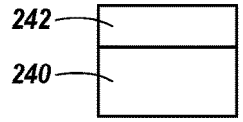 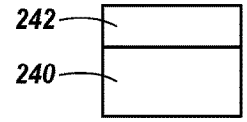 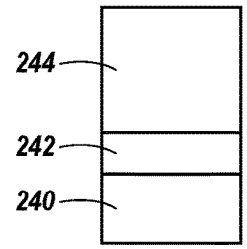
*Fig. 2A*  *Fig. 2B*  *Fig. 2C*
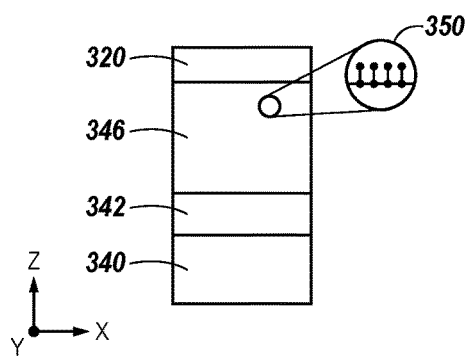 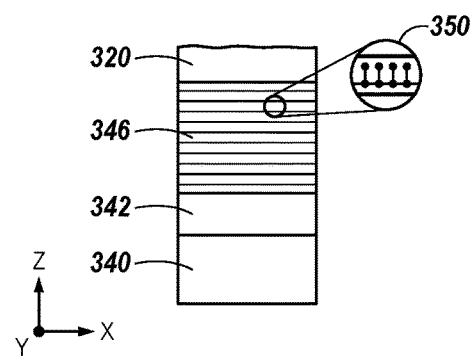
*Fig. 3A*  *Fig. 3B*

TEXTURED MEMORY CELL STRUCTURES

PRIORITY INFORMATION

This application is a Divisional of U.S. application Ser. No. 15/223,136 filed Jul. 29, 2016, the specification of which is incorporated herein by reference.

TECHNICAL FIELD

The present disclosure relates generally to semiconductor memory devices and methods, and more particularly, textured memory cell structures and methods for forming the same.

BACKGROUND

Memory devices are utilized as non-volatile memory for a wide range of electronic applications in need of high memory densities, high reliability, and data retention without power. Non-volatile memory may be used in, for example, personal computers, portable memory sticks, solid state drives (SSDs), digital cameras, cellular telephones, portable music players such as MP3 players, movie players, and other electronic devices.

Memory devices are typically provided as internal, semiconductor, integrated circuits in computers or other electronic devices. There are many different types of memory, including random-access memory (RAM), read only memory (ROM), dynamic random access memory (DRAM), synchronous dynamic random access memory (SDRAM), flash memory, and resistance variable memory, among others. Types of resistance variable memory include phase change random access memory (PCRAM) and resistive random access memory (RRAM), for instance.

Resistance variable memory devices, such as PCRAM devices, can include a resistance variable material, e.g., a phase change material, for instance, which can be programmed into different resistance states to store data. The particular data stored in a phase change memory cell can be read by sensing the cell's resistance, e.g., by sensing current and/or voltage variations based on the resistance of the phase change material.

BRIEF DESCRIPTION OF THE DRAWINGS

FIGS. 2A-2C illustrate a cross-sectional view of a portion of a memory cell in accordance with a number of embodiments of the present disclosure.

FIGS. 3A-3B illustrate a cross-sectional view of a portion of a memory cell in accordance with a number of embodiments of the present disclosure.

DETAILED DESCRIPTION

Figure 1:
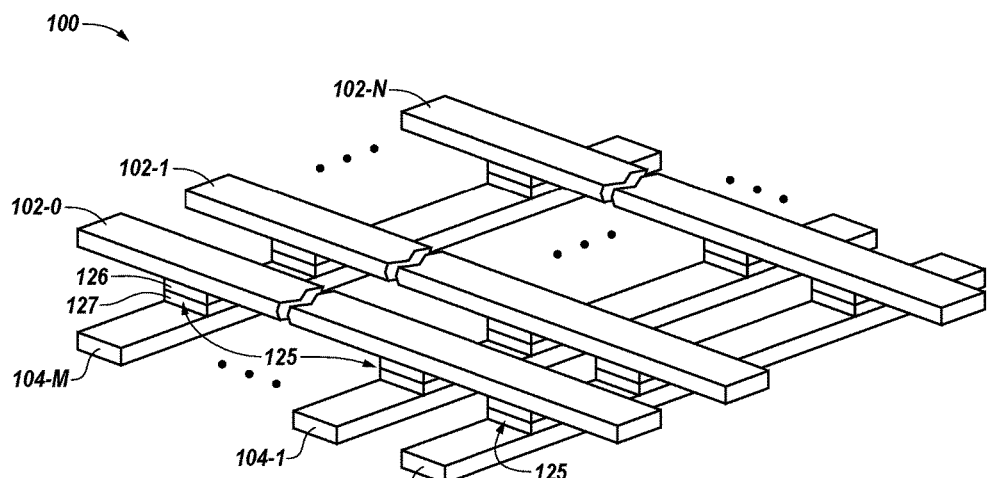
FIG. 1 is a block diagram of a portion of an array of memory cells in accordance with a number of embodiments of the present disclosure.

The present disclosure includes textured memory cell structures and method of forming the same. In one or more embodiments, a memory cell includes a buffer portion formed on an amorphous portion and an active portion formed on the buffer portion, wherein the active portion is textured with a single out of plane orientation.

In a number of embodiments, a memory cell having an active portion that is textured with a single out of plane orientation can have advantages over memory cells that do not. A memory cell with an active portion that is textured with a single out of plane orientation can have better uniformity of the active portion across the die than other types of variable resistance memory cells. Memory cells with an active portion that is textured with a single out of plane orientation can have a better size control of the cells inside the array, which can have positive effects on cell to cell variability, such as tighter resistance state distribution, lower programming current ranges, higher endurance. A memory cell having an active portion with a crystalline multi-material chalcogenide, such as a chalcogenide super lattice (CSL) that is textured with a single out of plane orientation can consume less current when be programmed between the set state, e.g., low resistance, and the reset state, e.g. high resistance. Also, such memory cells with a crystalline multi-material chalcogenide having an active portion that is textured with a single out of plane orientation can transition between the set state and reset state more quickly than other types of variable resistance memory cells.

Memory cells formed according the embodiments of the present disclosure can include an active portion that is textured with a single out of plane orientation by forming the active portion on a buffer portion that is also textured with a single out of plane orientation. The buffer portion can be formed with a single out of plane orientation by forming a chalcogenide on an amorphous portion, e.g., amorphous carbon, at low temperature, e.g., approximately 50° C. The buffer portion is then annealed to crystallize the chalcogenide with a single out of plane orientation. Once the buffer portion is formed having a single out of plane orientation, the active portion of the memory cell can be formed on the buffer portion and the active portion can also have a single out of plane orientation. In previous approaches, the active portion was formed on the amorphous portion, which resulted in a polycrystalline active region that did not have a single out of plane orientation.

In the following detailed description of the present disclosure, reference is made to the accompanying drawings that form a part hereof, and in which is shown by way of illustration how a number of embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

As used herein, "a number of" something can refer to one or more such things. For example, a number of memory devices can refer to one or more memory devices. Additionally, the designators "N" and "M" as used herein, particularly with respect to reference numerals in the drawings, indicates that a number of the particular feature so designated can be included with a number of embodiments of the present disclosure.

The figures herein follow a numbering convention in which the first digit or digits correspond to the drawing figure number and the remaining digits identify an element or component in the drawing. Similar elements or components between different figures may be identified by the use of similar digits. For example, 208 may reference element "08" in FIG. 2, and a similar element may be referenced as 308 in FIG. 3. As will be appreciated, elements shown in the various embodiments herein can be added, exchanged, and/ or eliminated so as to provide a number of additional embodiments of the present disclosure. In addition, as will be appreciated, the proportion and the relative scale of the elements provided in the figures are intended to illustrate the embodiments of the present disclosure, and should not be taken in a limiting sense.

FIG. 1 is a block diagram of a portion of an array 100 of memory cells 125 in accordance with a number of embodiments of the present disclosure. The array 100 can be a two terminal cross-point array having memory cells 125 located at the intersections of a first plurality of conductive lines, e.g., access lines, 102-0, 102-1, . . . 102-N, which may be referred to herein as word lines, and a second plurality of conductive lines, e.g., data/sense lines, 104-0, 104-1, . . . 104-M, which may be referred to herein as bit lines. The designators N and M can have various values. Embodiments are not limited to a particular number of word lines and/or bit lines. As illustrated, the word lines 102-0, 102-1, . . . 102-N are parallel to each other and are orthogonal to the bit lines 104-0, 104-1, . . . 104-M, which are substantially parallel to each other; however, embodiments are not so limited. The conductive lines can include conductive material, e.g., a metal material. Examples of the conductive material include, but are not limited to, tungsten, copper, titanium, aluminum, and/or combinations thereof, among other conductive materials.

Each memory cell 125 may include a memory element 126, e.g., a resistive memory element, coupled in series with a select device 127, e.g., an access device, in accordance with a number of embodiments described herein. The memory element 126 and the select device 127 are discussed further herein.

The select devices 127 can be operated, e.g., turned on/off, to select/deselect the memory element 126 in order to perform operations such as data programming, e.g., writing, and/or data sensing, e.g., reading operations. The select device 127 can be a diode, a bipolar junction transistor, a MOS transistor, and/or an Ovonic threshold switch, among other devices. In operation, appropriate voltage and/or current signals, e.g., pulses, can be applied to the bit lines and word lines in order to program data to and/or read data from the memory cells 125. The memory cells 125 can be programmed to a set state, e.g., low resistance, or a reset state, e.g., high resistance. As an example, the data stored by a memory cell 125 of array 100 can be determined by turning on a select device 127 and sensing a current through the memory element 126. The current sensed on the bit line corresponding to the memory cell 125 being read corresponds to a resistance level of the memory element, e.g., a resistance level of a resistance variable material, which in turn may correspond to a particular data state, e.g., a binary value. The array 100 can have an architecture other than that illustrated in FIG. 1, as will be understood by one of ordinary skill in the art.

The array 100 can be a two dimensional array. For example, the memory cells 125 of the array 100 can be arranged between the access lines, 102-0, 102-1, . . . , 102-N and the data/sense lines, 104-0, 104-1, . . . , 104-M in a single level. The array 100 can be a three dimensional array. For example, the memory cells of the array can be arranged in multiple levels, where each of the multiple levels has memory cells organized in a cross point architecture. For three dimensional array embodiments of the present disclosure, a vertical string of memory cells can be coupled to a data line and a plurality of access lines coupled to the vertical string of memory cells, for instance.

The access lines 102-0, 102-1, . . . , 102-N and the data/sense lines 104-0, 104-1, . . . , 104-M can be coupled to decoding circuits formed in a substrate material, e.g., formed adjacent to or for example below, the array 100 and used to interpret various signals, e.g., voltages and/or currents, on the access lines and/or the data/sense lines. As an example, the decoding circuits may include row decoding circuits for decoding signals on the access lines, and column decoding circuits for decoding signals on the data/sense lines.

As used in the present disclosure, the term substrate material can include silicon-on-insulator (SOI) or silicon-on-sapphire (SOS) technology, doped and undoped semiconductors, epitaxial layers of silicon supported by a base semiconductor foundation, conventional metal oxide semiconductors (CMOS), e.g., a CMOS front end with a metal backend, and/or other semiconductor structures and technologies. Various elements, e.g., transistors, and/or circuitry, such as decode circuitry for instance, associated with operating the array 100 can be formed in/on the substrate material such as via process steps to form regions or junctions in the base semiconductor structure or foundation.

The memory cells 125 can be formed using various processing techniques such as atomic material deposition (ALD), physical vapor deposition (PVD), chemical vapor deposition (CVD), supercritical fluid deposition (SFD), molecular beam expitaxy (MBE), patterning, etching, filling, chemical mechanical planarization (CMP), combinations thereof, and/or other suitable processes. In accordance with a number of embodiments of the present disclosure, materials may be grown in situ.

FIGS. 2A-2C illustrate a cross-sectional view of a portion of a memory cell in accordance with a number of embodiments of the present disclosure. The portion of the memory cell in FIGS. 2A-2C can be a portion of a memory cell in an array such memory cells 125 in array 100 illustrated in FIG. 1.

FIG. 2A illustrates a portion of a memory element 226 of a memory cell in accordance with one or more embodiments of the present disclosure. As illustrated in FIG. 2A, an amorphous portion 240 can be formed. The amorphous portion 240 can be amorphous carbon, for example, among other amorphous materials. The amorphous portion 240 can be formed, e.g., deposited, on a select device, such as select device 127 in FIG. 1. A buffer portion 242 can be formed on the amorphous portion. The buffer portion 242 can be a chalcogenide, such as antimony (Sb) or antimony telluride ($Sb_2Te_3$), for example, among other chalcogenides. The buffer portion 242 can be formed at approximately 50° C. to a thickness of approximately 1 nanometer (nm) to 5 nm.

FIG. 2B illustrates a portion of an array of memory cells shown in a stage subsequent to that shown in FIG. 2A. In FIG. 2B, once the buffer portion 242 is deposited on the amorphous portion 240, the buffer portion 242 is annealed to approximately 220-260° C., which forms a crystal structure. The buffer portion 242 can be exposed to a tellurium flux during the annealing process. The buffer portion 242 can have a textured crystal structure, where the textured crystal structure includes a single out of plane orientation. The single out of plane orientation can be in the z direction. The z direction can be substantially perpendicular to a an upper surface of a substrate and/or the upper surface of the amorphous portion 240. For example the single out of plane orientation can be in the 00.3n, 00.9, and/or 00.1 direction, among other directions. The buffer portion 242 is then cooled to approximately 210-240° C.

FIG. 2C illustrates a portion of an array of memory cells shown in a stage subsequent to that shown in FIG. 2B. In FIG. 2C, an active portion 244 of the memory element 226 can be formed, e.g., deposited, on the buffer portion 242. The active portion 244 can be a resistance variable material, such as a chalcogenide, for example. In a number of embodiments, the active portion 244 can be a mono crystal chalcogenide. For example, the active portion 244 can be antimony telluride ($Sb_2Te_3$). In a number of embodiments, the active portion can include portion 244 and portion 242. In a number of embodiments, the active portion 244 can be a crystalline multi-material chalcogenide. For example, the active portion can be a chalcogenide super lattice (CSL), which can include a number of chalcogenide portions. The active portion can include alternating portions of germanium telluride (GeTe) and antimony telluride ($Sb_2Te_3$), for example.

The active portion 244 can be formed epitaxially on the buffer portion 242 at a temperature of approximately 210-240° C. For example, the active portion 244 can be formed at a temperature of approximately 227° C. The active portion 244 can have a textured crystal structure, where the textured crystal structure includes a single out of plane orientation. The single out of plane orientation can be in the z direction, for example the single out of plane orientation can be in the 00.3n, 00.9, and/or 00.1 direction.

FIGS. 3A-3B illustrate a cross section of a portion a memory cell in accordance with one or more embodiments of the present disclosure. The portion of the memory cell in FIGS. 3A-3C can be a portion of a memory cell in an array such memory cells 125 in array 100 illustrated in FIG. 1.

FIG. 3A illustrates a memory element 326 of a memory cell in accordance with one or more embodiments of the present disclosure. In FIG. 3A, the memory element 326 can include an amorphous portion 340, a buffer portion 342, an active portion that is a mono crystal chalcogenide 346, and an electrode 320. The mono crystal chalcogenide 346 can be the same material as the buffer portion 342. The mono crystal chalcogenide 346 can also be a different chalcogenide as the buffer portion 342. The mono crystal chalcogenide 346 can be a resistance variable material, e.g., a phase change material. The resistance variable material can be a chalcogenide, e.g., a Ge—Sb—Te material such as $Ge_2Sb_2Te_5$, $Ge_1Sb_2Te_4$, $Ge_1Sb_4Te_7$, etc., or antimony telluride ($Sb_2Te_3$), among other resistance variable materials. The hyphenated chemical composition notation, as used herein, indicates the elements included in a particular mixture or compound, and is intended to represent all stoichiometries involving the indicated elements. Other resistance variable materials can include Ge—Te, In—Se, Sb—Te, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, and Ge—Te—Sn—Pt, for example.

The mono crystal chalcogenide can be formed to a thickness of approximately 5 nm to 70 nm. In FIG. 3A, the mono crystal chalcogenide 346 can have a thickness of approximately 30 nm to 40 nm. The mono crystal chalcogenide 346 can have a textured crystal structure, where the textured crystal structure includes a single out of plane orientation 350. The single out of plane orientation 350 can be in the z direction, for example the single out of plane orientation 350 can be in the 00.3n, 00.9, and/or 00.1 direction.

FIG. 3B illustrates a memory element 326 of a memory cell in accordance with one or more embodiments of the present disclosure. In FIG. 3B, the memory element 326 can include an amorphous portion 340, a buffer portion 342, an active portion that is a crystalline multi-material chalcogenide 348, and an electrode 320. The crystalline multi-material chalcogenide 348 can include a number of chalcogenide portions, as illustrated in FIG. 3B.

Each of the chalcogenide portions of the crystalline multi-material chalcogenide portion 348 can have a thickness in a range from 0.5 nanometer to 10 nanometers and the crystalline multi-material chalcogenide portion 348 can have a thickness of approximately 5 nm to 100 nm. The chalcogenide portions of the crystalline multi-material chalcogenide portion 348 can include alternating combinations of chalcogenides. For example, the crystalline multi-material chalcogenide portion 348 can include alternating portions of germanium telluride (GeTe), with a thickness of approximately 0.9 nm, and antimony telluride ($Sb_2Te_3$), with a thickness of approximately 4 nm.

The chalcogenide portions of crystalline multi-material chalcogenide portion 348 can be a resistance variable material, e.g., a phase change material. The resistance variable material can be a chalcogenide, e.g., a Ge—Sb—Te material such as $Ge_2Sb_2Te_5$, $Ge_1Sb_2Te_4$, $Ge_1Sb_4Te_7$, etc., or antimony telluride ($Sb_2Te_3$), among other resistance variable materials. The hyphenated chemical composition notation, as used herein, indicates the elements included in a particular mixture or compound, and is intended to represent all stoichiometries involving the indicated elements. Other resistance variable materials can include Ge—Te, In—Se, Sb—Te, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, and Ge—Te—Sn—Pt, for example.

The chalcogenide portions of crystalline multi-material chalcogenide portion 348 can have a textured crystal structure, where the textured crystal structure includes a single out of plane orientation 350. The single out of plane orientation 350 can be in the z direction, for example the single out of plane orientation 350 can be in the 00.3n, 00.9, and/or 00.1 direction.

Figure 4:
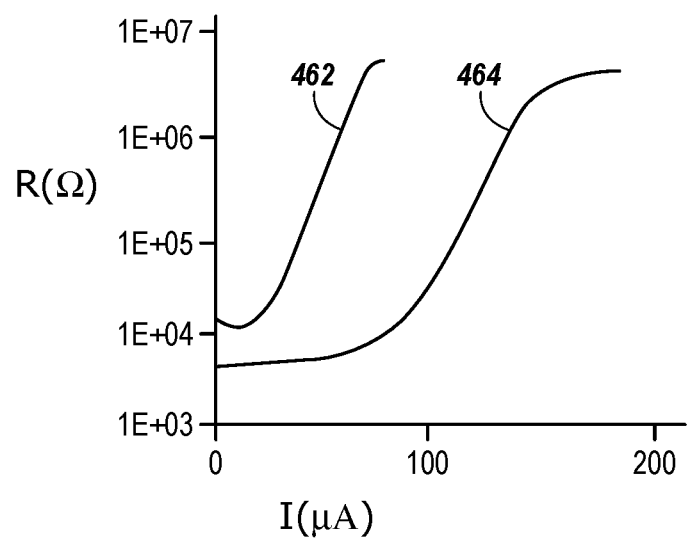
FIG. 4 is a graph of current vs resistance for memory cells in accordance with a number of embodiments of the present disclosure.

FIG. 4 is a graph of current vs resistance for memory cells in accordance with a number of embodiments of the present disclosure. FIG. 4 illustrates a current-resistance (I-R) curve for a memory cell in accordance with a number of embodiments of the present disclosure 462 and a I-R curve for a memory cell in accordance with previous approaches 464. Curves 462 and 464 illustrate that a memory cell with a crystalline multi-material chalcogenide in accordance with a number of embodiments of the present disclosure, having a textured crystal structure with a single out of plane orientation, consume less current when transitioning between the set state and the reset states than a memory cell in accordance with previous approaches, having a polycrystalline structure. A programming pulse used to transition a memory cell in accordance with a number of embodiments of the present disclosure between the set state, e.g., low resistance, and reset state, e.g., high resistance state, can be ⅓ to ½ of a programming pulse used to transition a memory cell between the set state, e.g., low resistance, and reset state, e.g., high resistance state in accordance with previous approaches. For example, a programming pulse of 70 µA can be used to program a memory cell according to embodiments of the present disclosure, while a programming pulse of 200 µA can be used to program a memory cell in accordance with previous approaches, such as a polycrystalline memory cell. Also, a memory cell with a crystalline multi-material chalcogenide having an active portion that is textured with a single out of plane orientation in accordance with a number of embodiments of the present disclosure can transition between the set state and the reset state more quickly than a memory cell in accordance with previous approaches due to the lower of amount of current consumed to make the transition between states.

The present disclosure includes textured memory cell structures and method of forming the same. In one or more embodiments, a memory cell includes a buffer portion formed on an amorphous portion and an active portion formed on the buffer portion, wherein the active portion is textured with a single out of plane orientation.

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of ordinary skill in the art upon reviewing the above description. The scope of a number of embodiments of the present disclosure includes other applications in which the above structures and methods are used. Therefore, the scope of a number of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method of forming a memory cells, comprising:
   forming a buffer on an amorphous material, wherein the amorphous material is carbon, wherein a first surface of the buffer is in contact only with the amorphous material, wherein forming the buffer includes depositing the buffer at approximately 50° C. and annealing the buffer to approximately 240° C., and wherein the buffer is antimony telluride ($Sb_2Te_3$) textured with a single out of plane orientation;
   cooling the buffer to approximately 227° C.; and
   forming a number of active materials having a single out of plane orientation on the buffer, wherein the number of active materials are textured with a single out of plane orientation, wherein forming the number of active materials include depositing the number of active materials at a temperature of approximately 227° C., and wherein the number of active materials are configured to be programmed to a set state corresponding to a low resistance state and to a reset state corresponding to a high resistance state.

2. The method of claim 1, wherein forming the number of active materials includes epitaxially growing a first chalcogenide.

3. The method of claim 1, wherein forming the number of active materials include epitaxially growing alternating portions of a first chalcogenide and a second chalcogenide.

4. The method of claim 1, including forming the buffer to a thickness of approximately 1 nanometer (nm) to 5 nm.

5. The method of claim 1, including forming the number of active materials to a thickness of approximately 5 nanometers (nm) to 70 nm.

6. A method of forming a memory cell, comprising:
   forming a first chalcogenide on an amorphous material, wherein the amorphous material is carbon, wherein a first surface of the first chalcogenide is in contact only with the amorphous material, wherein forming the first chalcogenide includes depositing the first chalcogenide at approximately 50° C. and annealing the first chalcogenide to approximately 240° C., and wherein the first chalcogenide is antimony telluride ($Sb_2Te_3$) textured with a single out of plane orientation;
   cooling the first chalcogenide to approximately 227° C.; and
   forming a second chalcogenide on the first chalcogenide, wherein the second chalcogenide has a single out of plane orientation and wherein forming the second chalcogenide include depositing the second chalcogenide at a temperature of approximately 227° C.

7. The method of claim 6, wherein forming the first chalcogenide includes forming an antimony telluride ($Sb_2Te_3$) portion to a thickness of approximately 1 nanometer (nm) to 5 nms.

8. The method of claim 6, wherein forming the second chalcogenide includes forming antimony telluride ($Sb_2Te_3$) to a thickness of approximately 5 nanometers (nm) to 70 nm.

9. The method of claim 6, wherein forming the second chalcogenide includes forming alternating portions of germanium telluride (GeTe) to a thickness of approximately 0.9 nm and antimony telluride ($Sb_2Te_3$) to a thickness of approximately 4 nm.

10. The method of claim 6, wherein forming the second chalcogenide includes forming a germanium antimony tellurium (GST).

11. The method of claim 6, wherein forming the second chalcogenide includes forming a chalcogenide superlattice (CSL).

12. The method of claim 6, wherein annealing the first chalcogenide includes exposing the first chalcogenide to a tellurium flux.

13. A method of forming a memory cell, comprising:
   forming a first chalcogenide on an amorphous material, wherein the amorphous material is carbon, wherein a first surface of the first chalcogenide is in contact only with the amorphous material, wherein forming the first chalcogenide includes depositing the first chalcogenide at approximately 50° C. and annealing the first chalcogenide to approximately 240° C., and wherein the first chalcogenide portion is an antimony telluride ($Sb_2Te_3$) crystal structure textured with a single out of plane orientation; and
   forming a second chalcogenide on the first chalcogenide, wherein the second chalcogenide has a single out of plane orientation and wherein forming the second chalcogenide includes cooling the first chalcogenide to approximately 227° C. prior to forming the second chalcogenide.

14. The method of claim 13, wherein forming the second chalcogenide includes forming a chalcogenide superlattice (CSL).

\* \* \* \* \*